US008179030B2

(12) United States Patent
Chowdhury (10) Patent No.: US 8,179,030 B2
(45) Date of Patent: May 15, 2012

(54) OXIDE MULTILAYERS FOR HIGH TEMPERATURE APPLICATIONS AND LAMPS

(75) Inventor: Ashfaqul Islam Chowdhury, Broadview Heights, OH (US)

(73) Assignee: General Electric Company, Schenectady, NY (US)

( * ) Notice: Subject to any disclaimer, the term of this patent is extended or adjusted under 35 U.S.C. 154(b) by 242 days.

(21) Appl. No.: 12/627,318

(22) Filed: Nov. 30, 2009

(65) Prior Publication Data

US 2011/0127899 A1 Jun. 2, 2011

(51) Int. Cl.
*H01J 61/40* (2006.01)

(52) U.S. Cl. ........................................ 313/112; 313/489

(58) Field of Classification Search .................. 313/489, 313/112

See application file for complete search history.

(56) References Cited

U.S. PATENT DOCUMENTS

| 5,627,426 | A | 5/1997 | Whitman et al. | |
|---|---|---|---|---|
| 6,156,388 | A | 12/2000 | Endres et al. | |
| 6,387,517 | B1 * | 5/2002 | Belleville et al. | 428/447 |
| 7,453,190 | B2 * | 11/2008 | Van Sprang | 313/110 |
| 2001/0020821 | A1 * | 9/2001 | Cottaar | 313/635 |
| 2002/0030426 | A1 * | 3/2002 | Boonekamp et al. | 313/112 |
| 2003/0170504 | A1 * | 9/2003 | Taninaka et al. | 428/702 |
| 2004/0219343 | A1 * | 11/2004 | DePauw | 428/212 |
| 2006/0008640 | A1 * | 1/2006 | Chonan et al. | 428/328 |
| 2007/0040509 | A1 | 2/2007 | Van Wijk | |
| 2007/0182334 | A1 * | 8/2007 | Ritz | 313/635 |
| 2009/0176641 | A1 * | 7/2009 | Kobayashi et al. | 501/78 |
| 2010/0103523 | A1 * | 4/2010 | Fukui et al. | 359/581 |

FOREIGN PATENT DOCUMENTS

| DE | 4407067 A1 | 9/1995 |
|---|---|---|
| JP | 2000100391 A | 4/2000 |
| WO | 2010/037787 A1 | 4/2010 |
| WO | 2010/047894 A1 | 4/2010 |

OTHER PUBLICATIONS

Jun-Yen Tewg, Author; Zirconium Tantalum Oxide High-K Gate Dielectric Films, a Dissertation presented to Texas A&M University; Dec. 2004; 256 pages.
WO Search Report issued in connection with corresponding WO Patent Application No. US10/053547 filed on Oct. 21, 2010.

* cited by examiner

Primary Examiner — Nimeshkumar Patel
Assistant Examiner — Christopher Raabe
(74) Attorney, Agent, or Firm — GE Global Patent Operation; Peter T. DiMauro (57) ABSTRACT

Disclosed herein are optical interference multilayer coatings employing a high refractive index material comprising a NbTaZr oxide. Such coatings provide enhanced retention of favorable optical and physical properties at high temperatures. Also disclosed herein are lamps comprising a light-transmissive envelope, at least a portion of the surface of the light-transmissive envelope being provided with the optical interference multilayer coating noted above. Such coatings, when used on lamps, may advantageously offer improved energy efficiencies for such lamps.

21 Claims, 5 Drawing Sheets

OXIDE MULTILAYERS FOR HIGH TEMPERATURE APPLICATIONS AND LAMPS

FIELD OF THE INVENTION

The present invention generally relates to optical multilayer coatings. In particular, some embodiments herein relate to optical multilayer coatings having high temperature resistance and their use in lamps and other applications.

BACKGROUND

Optical interference coatings, sometimes also referred to as thin film optical coatings or filters, comprise alternating layers of two or more materials of different indices of refraction. Some such coatings or films have been used to selectively reflect or transmit light radiation from various portions of the electromagnetic radiation spectrum, such as ultraviolet, visible and infrared radiation. For instance, optical interference coatings are commonly used in the lamp industry to coat reflectors and lamp envelopes. One application in which optical interference coatings are useful, is to improve the illumination efficiency or efficacy of lamps, by reflecting energy emitted (by, e.g., a filament or arc) back towards the filament or arc while transmitting visible light of the electromagnetic spectrum emitted by the light source. This decreases the amount of electrical energy necessary for the light source to maintain its operating temperature.

Optical interference coatings generally comprises two different types of alternating layers, one having a low refractive index and the other having a high refractive index. With these two materials having different indices of refraction, an optical interference coating, which can be deposited on the surface of the lamp envelope, can be designed. In some cases, the coating or filter transmits the light in the visible spectrum region emitted from the light source while it reflects the infrared light. The returned infrared light heats the light source during lamp operation and, as a result, the lumen output of a coated lamp is considerably greater than the lumen output of an uncoated lamp.

With the advent of potential energy regulations for incandescent and halogen lamps, it has become increasingly important to develop and introduce energy efficient products.

BRIEF SUMMARY OF THE INVENTION

One embodiment of the present invention is directed to an optical interference multilayer coating comprising a plurality of alternating first and second layers, the first layers having relatively low refractive index and the second layers having relatively higher refractive index than the first layers. The second layers comprise at least a NbTaZr oxide satisfying the atom ratios: Nb/(Nb+Ta+Zr) < about 30%; and Ta/(Nb+Ta+Zr) > about 50%.

A further embodiment of the present invention is directed to a lamp comprising a light-transmissive envelope having a surface, and at least one light source, the envelope at least partially enclosing the at least one light source. At least a portion of the surface of the light-transmissive envelope is provided with an optical interference multilayer coating. The coating comprises a plurality of alternating first and second layers, the first layers having relatively low refractive index and the second layers having relatively higher refractive index than the first layers. The second layers comprise at least a NbTaZr oxide satisfying the atom ratios: Nb/(Nb+Ta+Zr) < about 30%; and Ta/(Nb+Ta+Zr) > about 50%.

Other features and advantages of this invention will be better appreciated from the following detailed description.

BRIEF DESCRIPTION OF THE DRAWINGS

Embodiments of the invention will now be described in greater detail with reference to the accompanying Figures.

DETAILED DESCRIPTION

In accordance with embodiments, an optical interference multilayer coating is provided, comprising a plurality of alternating first and second layers. The first layers have a relatively low refractive index, and the second layers have a relatively higher refractive index than the first layers. Characteristically, some or all of the second layers comprise at least some NbTaZr oxide. In some embodiments, all of the second layers are substantially completely composed of NbTaZr oxide.

Coatings according to embodiments of the invention can be utilized for any of a wide variety of applications where optical interference coatings are desired or typically used. These include, for example, lighting applications (e.g., lamps), optical waveguides, reflectors, decorative materials, security printing; or the like. As a result of the high temperature resistance of the coatings according to embodiments of the present invention, they may also be employed in many applications which require high temperature resistance, such as in laser applications or other high temperature optics (such as in high speed aircraft or missiles).

In some embodiments the coatings are configured to selectively reflect one portion of the electromagnetic spectrum while transmitting another portion of the electromagnetic spectrum. For instance, the coatings can be used as a "cold mirror" or a "hot mirror". A "cold mirror" is an optical filter that reflects visible light while at the same time permitting longer wavelength infrared energy to pass through the filter. A "hot mirror" is an optical filter that reflects infrared radiation while at the same time permitting shorter wavelength visible light to pass through the filter. One nonlimiting application of hot mirrors herein is to return infrared heat to the filament of a lamp in order to increase lamp efficiency.

In accordance with embodiments of the invention, the chemical composition of the NbTaZr oxide used will simultaneously satisfy both of the following atom ratios: Nb/(Nb+Ta+Zr) < about 30%; and, Ta/(Nb+Ta+Zr) > about 50%. The balance of the metals in the NbTaZr oxide may be substantially Zr. In a more specific embodiment, the NbTaZr oxide used may simultaneously satisfy both of the following the atom ratios: about 5% <Nb/(Nb+Ta+Zr) < about 30%; and, about 80%> Ta/(Nb+Ta+Zr) >about 50%. Again, the balance of the metals in the NbTaZr oxide may be substantially Zr. In a yet further more specific embodiment, the NbTaZr oxide may satisfy the atom ratios: about 5% < Nb/(Nb+Ta+Zr) < about 10%; and, about 75% > Ta/(Nb+Ta+Zr) > about 65%; and, about 20% < Zr/(Nb+Ta+Zr) < about 25%.

The NbTaZr oxide employed may be referred to as a mixed metal oxide. As used herein, the term "mixed metal oxide" may be defined in terms of being mixtures of metal oxides; solid solutions of metal oxides; stoichiometric or nonstoichiometric compounds of metal oxides; or combinations of the foregoing. For instance, and by way of example only, a "NbTaZr oxide" is intended to refer to any one or more of the following: (1) a mixture comprising a niobium oxide, a tantalum oxide, and a zirconium oxide; (2) a solid solution of $Nb_2O_5$, $Ta_2O_5$ and $ZrO_2$; (3) a compound $Nb_aTa_bZr_cO_d$ where a, b and c are positive real numbers and d=2.5a+2.5b+2c (when Nb is pentavalent) or d=1.5a+2.5b+2c (when Nb is trivalent); (4) an oxygen-deficient nonstoichiometric compound $Nb_aTa_bZr_cO_{d-\delta}$ where a, b, c, d are as above and δ is less than about 0.2; (5) an oxygen-excess nonstoichiometric compound $Nb_aTa_bZr_cO_{d+\delta}$ where a, b, c, d and δ are as above; or combinations of the foregoing; or the like. For instance, a "NbTaZr oxide" may comprise discrete molecules of the respective oxides (e.g., as in a mixture); or may be an oxide of an Nb/Ta/Zr matrix.

As noted, the first layers of the optical interference multilayer coating have a relatively low refractive index and are thus sometimes referred to as "low index" layers. These first layers are generally at least spectrally adjacent to the second layers, and more typically are also physically adjacent to the second layers. It is typical, although not always necessary, that the first and second layers are both alternating and adjacent. In general, low index layers may be composed of materials having a refractive index of from about 1.35 to about 1.7 when measured in light having a wavelength of 550 nm. Typically, these low index layers may include a material independently selected from ceramic materials, refractory materials, silicon, oxides of metals or metalloids, nitrides of metals or metalloids; fluorides of metals or metalloids; or the like. Fluorides of metals may include compounds such as $MgF_2$. Often, these low index layers may include a silicon oxide, such as glass or quartz or other form of amorphous or crystalline silica. The most commonly employed low index material is one or more form of $SiO_2$ (silica) due to its low refractive indices, low cost, and favorable thermal property.

In general, the second layers (sometimes referred to as the "high index" layers) are composed of materials having a refractive index of from about 1.7 to about 2.8 at 550 nm. In addition to the NbZrTa oxide component of the second layers noted above, additional high index materials may be independently selected from one or more oxides (or mixed oxides) of one or more metal selected from the group consisting of Ti, Hf, W, Mo, and In; or the like.

In accordance with embodiments, the optical interference multilayer coating may have a geometrical thickness of from about 0.001 micrometers ("microns") to about 25 microns. More typically, the geometrical thickness may be from about 1 to about 20 microns; or, from about 3 to about 18 microns. Measurement of such thickness of coating does not generally include the thickness of any substrate. A relatively thicker total coating can lead to higher efficiency for applications where the optical interference multilayer coating is configured to act as a bandpass filter which reflects infrared radiation and transmits visible radiation.

The individual high and low refractive index layers may typically have a thickness of from about 20 nm to about 500 nm, or sometimes from about 10 nm to about 200 nm. In accordance with embodiments, the optical interference multilayer coating may have any number of layers, or more specifically, a total number of layers of any integer from about 4 to about 250 layers inclusive. All integral values there between are specifically contemplated. Different applications will require differing numbers of layers, with differing thickness of each individual first and second layer. In some specific embodiments, the optical interference multilayer coating may have a total number of layers of about 120 with a geometrical thickness of about 11 microns, or may have a total number of layers of about 210 with a geometrical thickness of about 18 microns.

In accordance with certain embodiments, the optical interference multilayer acts as a hot mirror, i.e., it transmits light in the visible spectrum region emitted from a light source while it reflects infrared light. In such embodiments, the optical interference multilayer coating may have an average transmittance of greater than about 60% in visible light of 400-750 nm wavelength. The optical interference multilayer coating when configured as a hot mirror may have average reflectance values in the infrared region as follows: greater than about 50% in infrared region of the electromagnetic spectrum of 800-1500 nm wavelength; greater than about 40% in infrared region of 1500-2500 nm wavelength; and greater than about 30% in infrared region of 2500-3500 nm wavelength.

In certain embodiments, the optical interference multilayer coating may be configured to have the ability to transmit visible light and reflect portions of the ultraviolet region of the spectrum. For example, coatings may be configured to provide an average transmittance in visible light of greater than 60% and provide an average reflectance of greater than about 30% (or even greater than about 60%) in the ultraviolet region of the electromagnetic spectrum of 300-370 nm wavelength.

By use of the high refractive index materials disclosed herein for the high index layer of optical interference coatings, one can obtain a material which can resist frequent temperature changes, especially changes which include increases to 800° C. or even higher. One manifestation of such high temperature resistance is, that coatings according to embodiments of the present invention often do not suffer from excessive delamination or from cracking. For instance, the optical interference multilayer coating is typically capable of repeated cycling between room temperature and greater than or equal to about 800° C. without significant mechanical degradation of the second (high index) layers; or of the first layers; or both. Another manifestation of enhanced temperature resistance is that coatings according to embodiments of the present invention often do not suffer from excessive light scattering in the visible region, even after exposure to very high temperatures on the order of about 800° C. or even higher (e.g., around 825° C.).

The multilayer coatings according to embodiments of the invention may be deposited by any suitable deposition technique known for depositing coating materials. For example, multilayer coatings may be deposited by physical vapor deposition processes (PVD) or by chemical vapor deposition processes (CVD). In general, PVD processes employed may be selected from the group consisting of: thermal evaporation; RF evaporation; electron beam evaporation; reactive evaporation; DC sputtering; RF sputtering; microwave sputtering; magnetron sputtering; microwave-enhanced DC magnetron sputtering; arc plasma deposition; reactive sputtering; laser ablation; and combinations thereof; or the like. Typically, CVD process employed may be selected from the group consisting of: atmospheric pressure CVD; low-pressure CVD; high-vacuum CVD; ultrahigh-vacuum CVD; aerosol-assisted CVD; direct liquid-injection CVD; microwave plasma-assisted CVD; plasma-enhanced CVD; remote plasma-enhanced CVD; atomic layer CVD; hot wire CVD; metal-organic CVD; hybrid physical-chemical vapor deposition; rapid thermal CVD; vapor phase epitaxy; and combinations thereof; or the like.

As is generally understood, in a typical chemical vapor deposition process, a substrate is exposed to one or more volatile or gas-like precursors (usually molecular precursors), which precursors react and/or decompose on the substrate surface to produce the desired deposit. There are a variety of different types of CVD processes, which may be classified by the features of their operating pressure, characteristics of the vapor, types of energy input, or other features. All of the following are to be included within the scope of "CVD" processes, as that term is used herein. For instance, some CVD processes include: atmospheric pressure CVD; low-pressure CVD (LPCVD) (wherein chemical vapor deposition typically occurs at sub-atmospheric pressures); and high- or ultrahigh-vacuum CVD, which is usually conducted at below about $10^{-6}$ Pa. In other forms of CVD, the precursor is not strictly in the gaseous state: aerosol-assisted CVD employs precursors as a liquid-gas aerosol, while direct liquid-injection CVD (DLICVD) uses liqueform precursors which are injected and transported to a substrate. Some CVD methods are assisted by energetic means, such as microwave plasma-assisted CVD (MPCVD), plasma-enhanced (or plasma-assisted) CVD (PECVD), and remote plasma-enhanced CVD (RPECVD). Other types of CVD may include atomic layer CVD (ALCVD), hot wire CVD (HWCVD), metal-organic CVD (MOCVD); hybrid physical-chemical vapor deposition (HPCVD), rapid thermal CVD (RTCVD), vapor phase epitaxy (VPE); and the like. These respective types of CVD are not always intended to be mutually exclusive; therefore, combinations employing more than one of the foregoing CVD processes are also contemplated.

Where LPCVD is used to deposit multilayer coatings, it may typically employ the process as set forth in U.S. Pat. No. 5,143,445. Additionally, any of the conditions and precursors shown in commonly owned U.S. Pat. No. 5,412,274 may be suitable for use in the present disclosure. Additionally exemplary chemical vapor deposition and low-pressure chemical vapor deposition processes, are described, for example, in U.S. Pat. Nos. 4,949,005, 5,143,445, 5,569,970, 6,441,541, and 6,710,520. All of these noted patents are hereby incorporated by reference in pertinent part.

As would be generally understood by persons skilled in the art, in a typical physical vapor deposition (PVD) process, a material is vaporized by a physical process and thereafter condensed at a substrate to form a deposit. Sometimes, the vaporized material can undergo a reaction such as oxidation (by reaction with oxygen). Often, a deposit is made on a substrate by the steps of converting the material to be deposited into vapor by a physical means, transporting the vapor from its source to the substrate, and condensing the vapor on the substrate. As used herein, PVD processes may include thermal evaporation, RF evaporation, electron beam evaporation, reactive evaporation, DC sputtering, RF sputtering, microwave sputtering, magnetron sputtering, microwave-enhanced DC magnetron sputtering, arc plasma deposition, reactive sputtering, laser ablation; and the like.

These respective types of PVD are not always intended to be mutually exclusive; therefore, combinations employing more than one of the foregoing PVD processes are also contemplated. For example, it would be understood that "magnetron sputtering" may be inclusive of both DC and RF magnetron sputtering. Similarly, it would be understood that "DC magnetron sputtering" may be inclusive of "microwave-enhanced DC magnetron sputtering". Where RF magnetron sputtering is used to deposit multilayer coatings, one may suitably employ processes shown in U.S. Pat. No. 6,494,997, hereby incorporated by reference in pertinent part. Magnetron sputtering is where a high-energy inert gas plasma is used to bombard a target. The sputtered atoms condense on the cold glass or quartz housing. DC (direct current), pulsed DC (40-400 KHz), or RF (radio frequency, 13.65 MHz) processes may be used.

When sputtering is employed, one may use a single target holding an alloy and/or mixture of the metals used for forming the mixed metal oxide of the high refractive index layer. Alternatively, multiple targets, each holding one or more metals, can be used. Yet furthermore, one or more targets containing a metal oxide or other compound can also be used. In general, such sputtering operations are typically carried out in an oxygen/argon atmosphere. Where the intended use of the coating is to act as a bandpass filter for a light source or lamp, the substrate which is coated may typically include a light-transmissive envelope of a lamp.

In some embodiments, the optical interference multilayer coating may be deposited upon a substrate. Such substrate may comprise a material selected from at least one of glass, quartz, fused silica, or substantially transparent ceramic; or the like. Where a substrate comprising a substantially transparent ceramic is employed, it may be selected from a material composed of one or more of polycrystalline alumina, sapphire and YAG (yttrium aluminum garnet); or the like. One example of substrate may be a lamp envelope made of any transparent or translucent material, such as quartz or glass or any of the named substrate substances above. The shape of the substrate is not particularly limited, but may include shapes such as cylindrical or elliptical or the like, for example.

In accordance with embodiments of the invention, there are also provided a lamp or lamps including the optical interference multilayer coatings of the present disclosure. Such lamps generally comprise a light-transmissive envelope having a surface, and a light source, with the envelope at least partially enclosing the light source. At least a portion of the surface of the light-transmissive envelope is provided with the optical interference multilayer coating as described above. As is generally known, such light-transmissive envelopes may be composed of any material which is light transmissive to an appreciable extent and is capable of withstanding relatively hot temperature (e.g., about 800° C. or even above); for example, it may be composed of glass, quartz, fused silica, or substantially transparent ceramic; or any of the substrate substances noted above.

The light source may be an incandescent source (for example, one which provides light through resistive heating of a filament); and/or it may be an electric arc discharge source, such as a high-intensity discharge (HID) source; and/or it may be another type of light source. Usually, where a filament is employed, it is composed of a refractory metal, generally in coiled form, such as tungsten or the like, as is well known. To energize the lamp, there is typically provided at least one electric element arranged in the envelope and connected to current supply conductors (or electrical leads) extending through the envelope.

Usually, the envelope encloses a fill gas. A preferable fill gas includes any gas or gaseous mixture which is selected to promote lamp life, quality, and/or performance. Some fill gases may include an ionizable fill gas, such as at least one rare gas (e.g., krypton or xenon), and/or a vaporizable halogen substance, such as an alkyl halide compound (e.g., methyl bromide). Halogen-containing gases may often be employed. Many other fill compositions are also contemplated, such as those which may include metal halides, mercury, and combinations thereof.

The lamp in accordance with this disclosure may have the optical interference multilayer coating on either the inner surface or the outer surface of the lamp envelope. Alternatively, the lamp may have the optical interference multilayer coating on both the inner surface and the outer surface of the lamp envelope.

Figure 1:
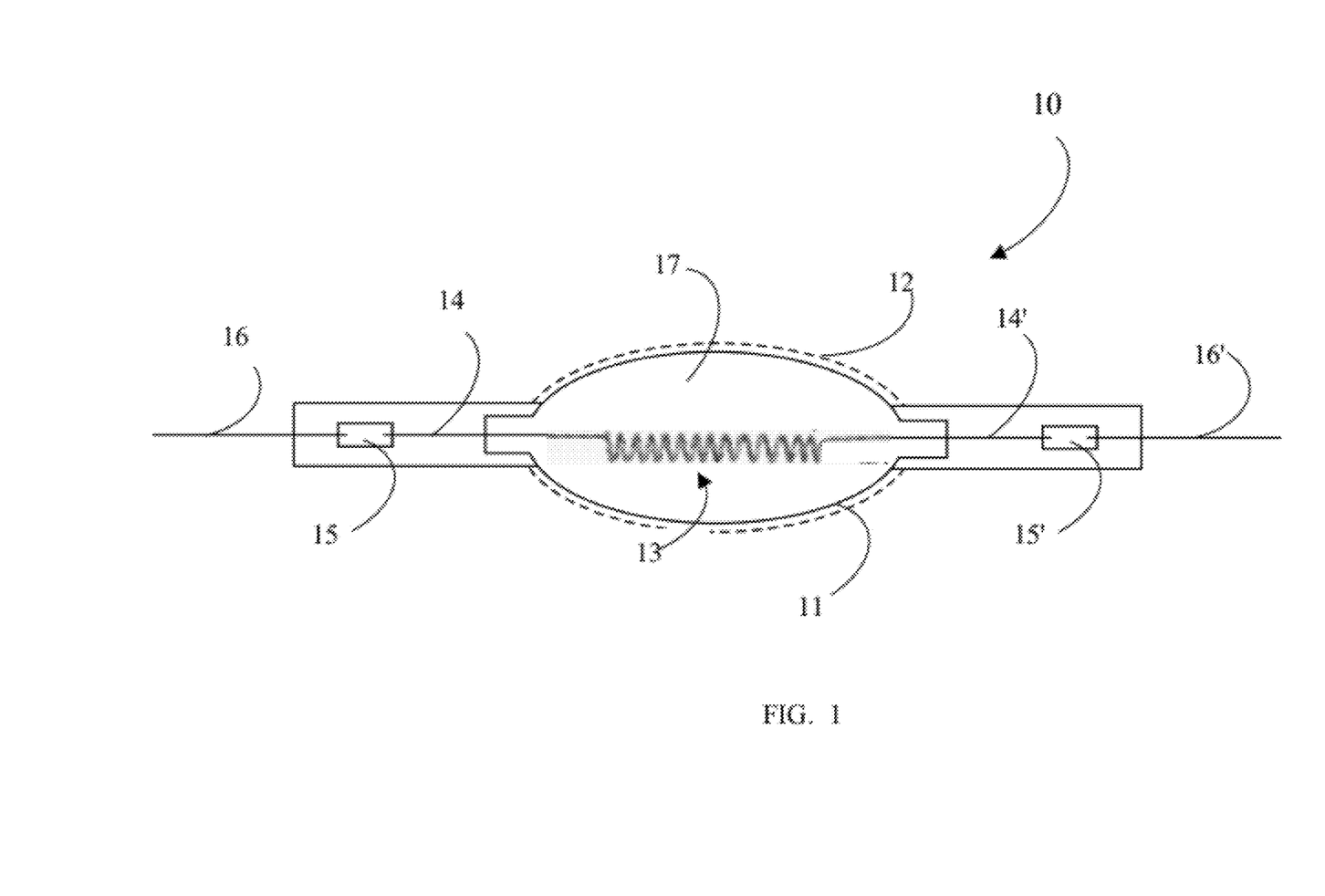
FIG. 1 is a schematic depiction of an exemplary lamp, in accordance with embodiments of the invention.

Referring now to FIG. 1, here is shown a schematic depiction of an exemplary lamp in accordance with embodiments of the invention. It is not intended to be limiting, and is not a scale drawing. In this illustrative embodiment, lamp 10 comprises a hermetically sealed, vitreous, light transmissive quartz envelope 11, the outer surface of which is coated with an optical interference multilayer coating 12. Envelope 11 encloses coiled tungsten filament 13 which can be energized by inner electrical leads 14,14'. The inner electrical leads 14,14' are welded to foils 15,15', and outer electrical leads 16,16' are welded to the opposite ends of the foils. In the interior 17 of envelope 11 is disposed an ionizable fill comprising a halogen or halogen compound.

The above-described optical interference coatings, when used as coatings on lamps, may advantageously offer improved energy efficiencies for such lamp, e.g. halogen lamps. Such improvement may be manifest in an increased value for LPW (lumen per watt). When expressed as percent, the increase in LPW is referred to as "gain". Halogen lamps when coated with optical interference films, in accordance with embodiments of the present invention, may exhibit a gain of from about 20% to about 150% (e.g., from about 90% to about 95%) versus uncoated lamps. Such comparisons are typically performed on the same lamps energized to the same hot filament temperature, e.g., at the temperature of usual operation.

For embodiments where the least one light source comprises a filament, the coating may be configured to have an average transmittance of greater than about 60% in visible light of 400-750 nm wavelength, and have an average reflectance of greater than about 50% in the infrared region of the electromagnetic spectrum of 800-1500 nm wavelength. For embodiments where the at least one light source comprises an electric arc or a discharge, the coating may be configured to provide an average transmittance in visible light of greater than 60% and provide an average reflectance of greater than about 30% in the ultraviolet region of the electromagnetic spectrum of 300-370 nm wavelength.

Furthermore, the above-described optical interference films may also exhibit high structural and optical integrity even after exposure to high temperatures. Embodiments of the present invention may provide lamps having an optical interference multilayer coating which is capable of repeated cycling between room temperature and about 750° C. or above (e.g., about 800° C.) without significant mechanical degradation of the first and second layers. Lamps coated according to embodiments of the present invention may typically exhibit a transmission loss of less than about 5% in the visible light of 400-750 nm wavelength after annealing of the coating at about 800° C. for about 4 d.

Yet furthermore, lamps coated with optical interference coatings in accordance with embodiments of the present invention, may exhibit improved consistency and performance stability, and have an improved appearance (smooth and clear coating surface).

In order to promote a further understanding of the invention, the following examples are provided. These examples are illustrative, and should not be construed to be any sort of limitation on the scope of the claimed invention.

EXAMPLES

Comparative Examples 1 and 2, and Example 3

The objective of these comparative experiments was to determine the maximum thermal stability temperature of thick multilayer coatings (120 layer bandpass filter configured to reflect IR, geometrical thickness about 11 microns) deposited by RF magnetron sputtering under ion bombardment, using identical conditions for each type of coating. The samples were deposited on quartz ingot of 1.27 cm×2.54 cm×1 mm, with silica used as low index material. The temperature conditions for tests were: air oven bake for 4 hours each at progressively increasing temperatures; temperature range 550-800° C. and ongoing at every 25° C. increment. That is, samples were held at 550° C. for 4 hours in air oven, then tested, then temperature was increased by 25° C. increment and held again for 4 hrs in air oven, then tested, then temperature was increased by 25° C. increment, etc.

In these examples, thermal stability is tested, in terms of the ability to retain the favorable optical and physical properties of the as-deposited material. Optical and physical properties were measured in terms of: (1) photometric efficiency (PE, in both specular and sphere) measured at each temperature; (2) bright field microscopy (50× magnification) at each temperature; and, (3) x-ray diffraction (XRD) measured first "as deposited", then immediately before failure of the coating, and then immediately after failure. A coating is given a positive rating as being "thermally stable" at a measured given temperature, if the PE (specular) transmittance drop between 400-500 nm is less than 1%, with respect to the as-deposited film. A coating is given a positive rating if it remains amorphous at the measured temperature as per XRD and/or microscopy. A coating is given a positive rating if it remains physically intact on substrate.

As noted in Table I, multilayers of silica and NbTa oxide (Comparative example 1) failed at 625° C. under these criteria, while multilayers of silica and Ta oxide (Comparative example 2) failed at 675° C. under these criteria. In contrast, multilayers using silica as low index material and NbTaZr oxide (Example 3) as high refractive index layers were thermally stable up to 800° C. The NbTaZr oxide was composed of 8.9 atom % Nb, 69.5 atom % Ta, and 21.6 atom % Zr on a metals basis (i.e., excluding oxygen).

TABLE I

| Temperature (deg. C.) | High Refractive Index Material NbTa oxide (Comparative example 1) | Ta oxide (Comparative example 2) | NbTaZr oxide (Example 3) |
|---|---|---|---|
| 550 | OK | OK | OK |
| 575 | OK | OK | OK |
| 600 | OK | OK | OK |
| 625 | Failed | OK | OK |
| 650 |  | OK | OK |
| 675 |  | Failed | OK |
| 700 |  |  | OK |
| 725 |  |  | OK |
| 750 |  |  | OK |
| 775 |  |  | OK |
| 800 |  |  | OK |

Since the NbTa oxide and Ta oxide materials failed (beginning at 625° C. and 675° C., respectively), they were not tested at higher temperatures, thus accounting for the blank spaces in Table I.

Figure 2:
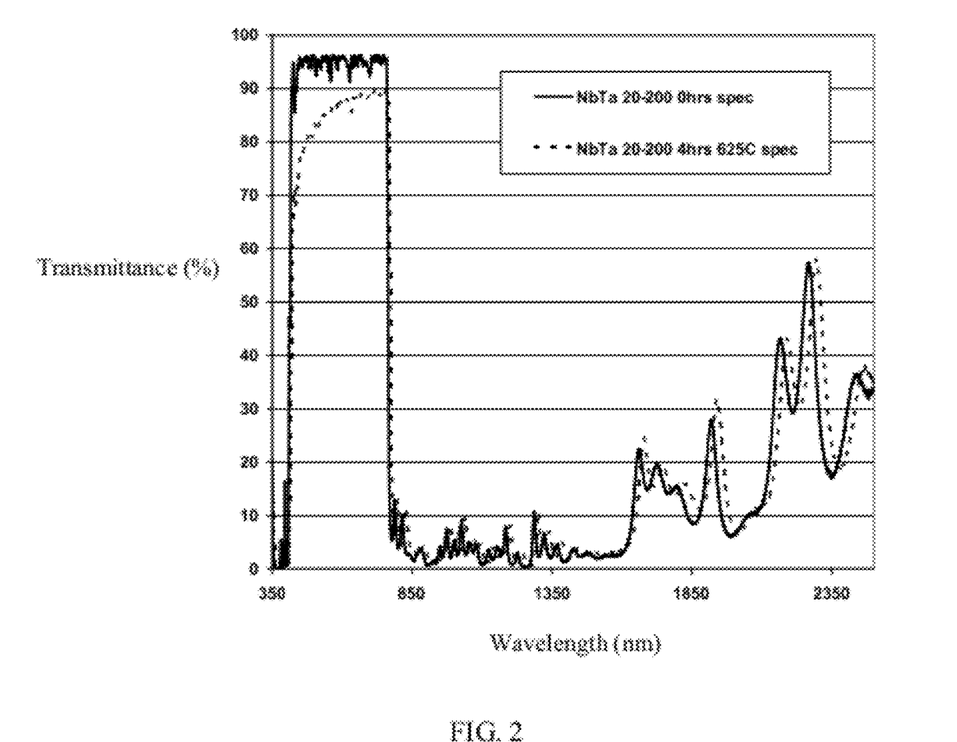
FIG. 2 is a graphical plot for the specular transmittance of a comparative material.
Figure 3:
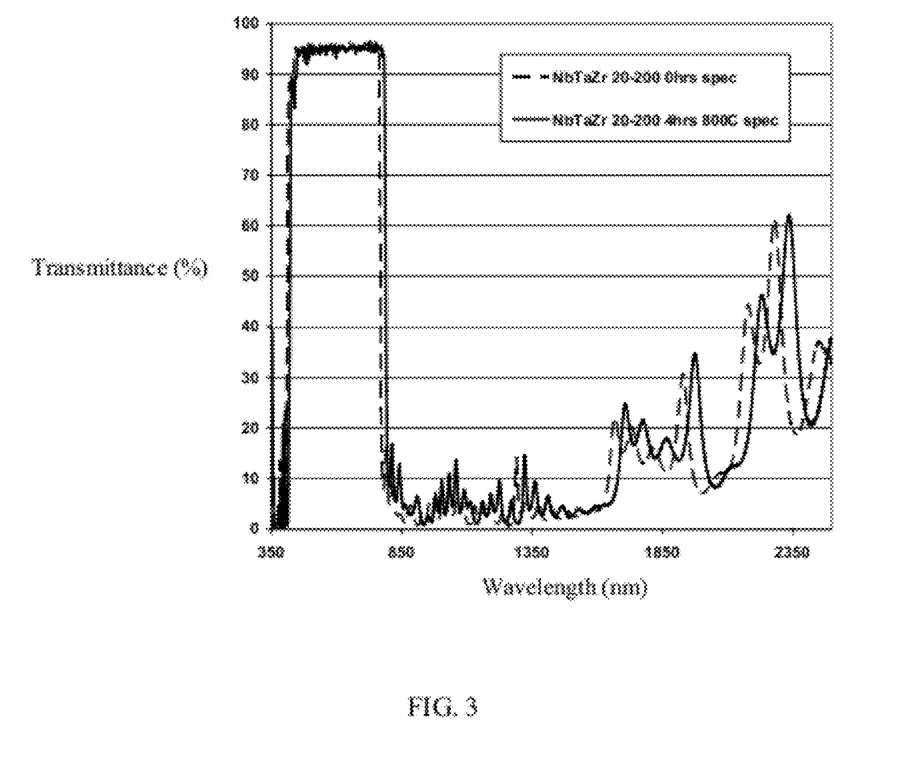
FIG. 3 is a graphical plot for the specular transmittance of an exemplary material, in accordance with embodiments of the invention.

FIG. 2 shows a graphical plot for the specular transmittance of the material using NbTa oxide for the high index layers (Comparative Example 1). The solid-line trace in FIG. 2 shows the transmittance data for the material in the as-deposited state, while the dashed-line trace shows the same material after 4 h at 625° C. The transmittance drop for the temperature aged material in the visible region is marked. In particular, the average transmittance in the region of from 400-500 nm dropped 16.4% in the aged material compared to the as-deposited. In contrast, FIG. 3 shows a graphical plot for the specular transmittance of the material using NbTaZr oxide for the high index layers (Example 3). In this figure, the solid line trace refers to the as-deposited material while the dashed-line trace is a temperature-aged material (exposed to 800° C. for 4 h). The transmittance in the visible region showed almost zero decrease throughout the visible region, indicative of remarkable temperature stability.

Figure 4A:
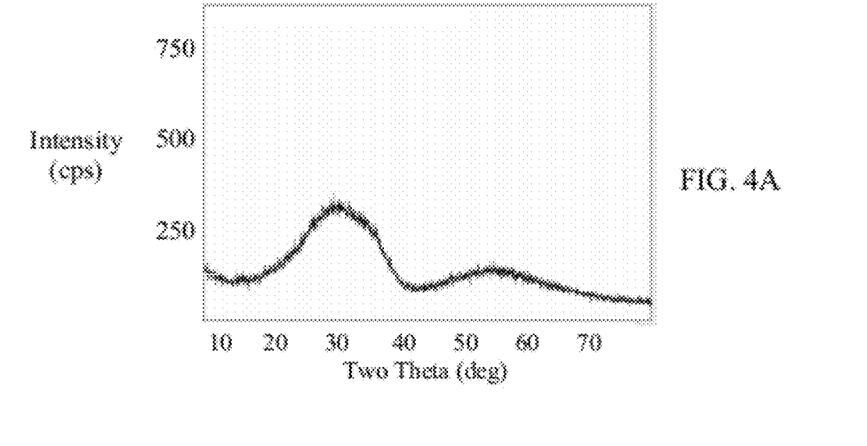
FIG. 4 represents X-ray crystallographic data for an exemplary material, in accordance with embodiments of the invention.
Figure 4B:
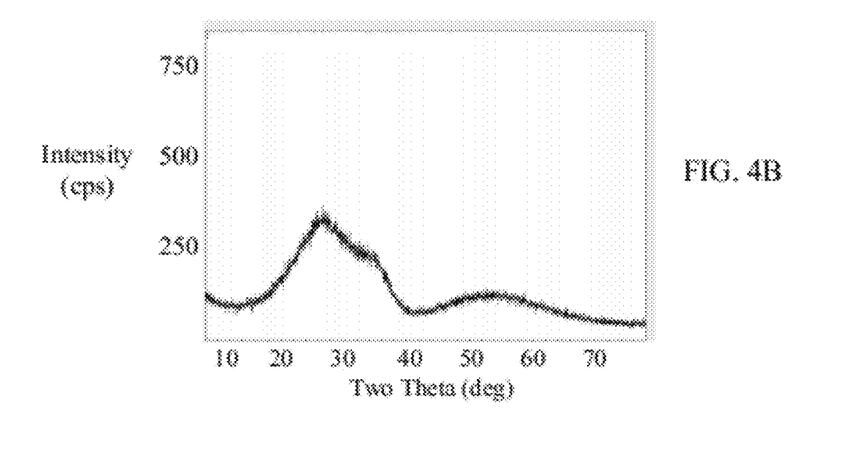
Figure 4C:
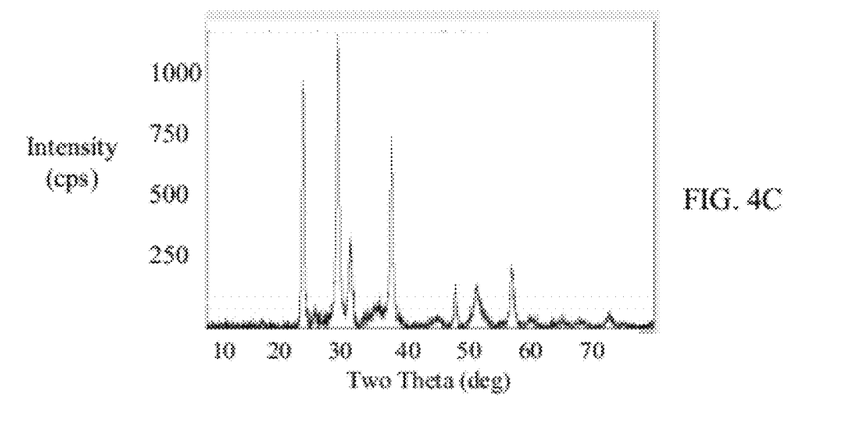

The transmittance of optical films is considered to be largely dependent upon the presence or absence of crystallites, which tend to scatter light. An amorphous composition for the layers is thus generally desired. FIG. 4 represents X-ray crystallographic graphs for the NbTaZr oxide material of Example 3, in as-deposited form (FIG. 4A), aged at 800° C. (FIG. 4B) and aged at 825° C. (FIG. 4C). The material retains a substantially amorphous state even at 800° C., as indicated by the lack of defined structure in the X-ray crystallographic plot of FIG. 4B. Only at 825° C. did significant crystallinity develop (FIG. 4C).

Figure 5:
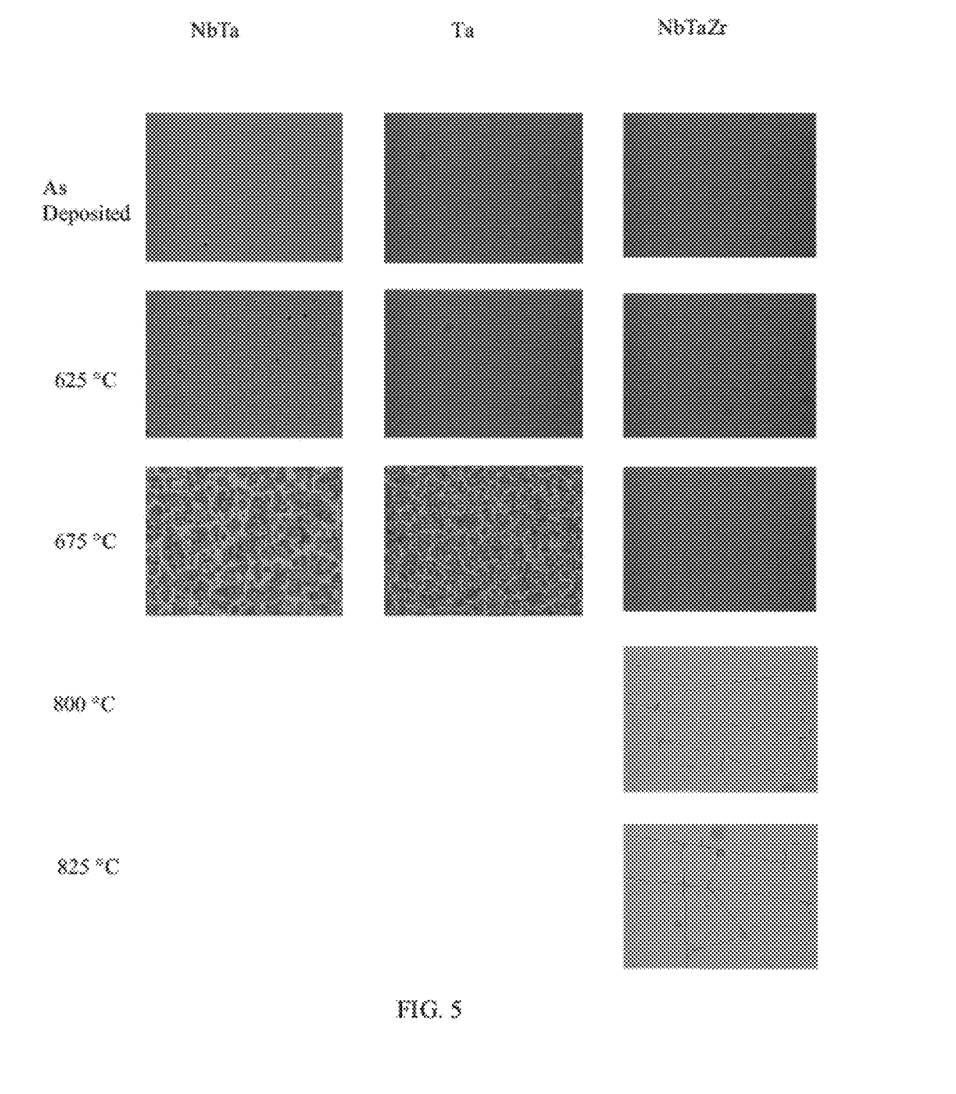
FIG. 5 shows photomicrographs of comparative materials and an exemplary material.

Photomicrographs (50× bright-field image results) of the optical interference multilayer coatings of Comparative examples 1 and 2 and Example 3, are shown in FIG. 5. As can be seen, after aging at 675° C., the materials of Comparative examples 1 and 2 began to develop significant cracking, while that of Example 3 was crack-free. Cracks were not seen to develop in the material of Example 3 unless heated to 800° C.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. The modifier "about" used in connection with a quantity is inclusive of the stated value and has the meaning dictated by the context (for example, includes the degree of error associated with the measurement of the particular quantity). "Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present. The singular forms "a", "an" and "the" include plural referents unless the context clearly dictates otherwise. All ranges disclosed herein are inclusive of the recited endpoint and independently combinable.

As used herein, the phrases "adapted to," "configured to," and the like refer to elements that are sized, arranged or manufactured to form a specified structure or to achieve a specified result. While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. An optical interference multilayer coating comprising, a plurality of alternating first and second layers, said first layers having relatively low refractive index and said second layers having relatively higher refractive index than the first layers, wherein said second layers comprise NbTaZr oxide satisfying the atom ratios:

$$Nb/(Nb+Ta+Zr) < about\ 30\%$$

and $$Ta/(Nb+Ta+Zr) > about\ 50\%.$$

2. The optical interference multilayer coating according to claim 1, wherein the balance of the metals in the NbTaZr oxide is substantially Zr.

3. The optical interference multilayer coating according to claim 1, wherein said second layers comprise NbTaZr oxide satisfying the atom ratios $$about\ 5\% < Nb/(Nb+Ta+Zr) < about\ 10\%$$

and $$about\ 75\% > Ta/(Nb+Ta+Zr) > about\ 65\%$$

and $$about\ 20\% < Zr/(Nb+Ta+Zr) < about\ 25\%.$$

4. The optical interference multilayer coating according to claim 1, wherein said coating has a geometrical thickness of from about 1 to about 20 microns.

5. The optical interference multilayer coating according to claim 1, wherein said coating has a total number of layers of from 4 to 250.

6. The optical interference multilayer coating according to claim 1, wherein said coating has an average transmittance of greater than about 60% in visible light of 400-750 nm wavelength.

7. The optical interference multilayer coating according to claim 6, wherein said coating has an average reflectance of greater than about 50% in infrared region of the electromagnetic spectrum of 800-1500 nm wavelength.

8. The optical interference multilayer coating according to claim 6, wherein said coating has an average reflectance of greater than about 40% in infrared region of the electromagnetic spectrum of 1500-2500 nm wavelength.

9. The optical interference multilayer coating according to claim 6, wherein said coating has an average reflectance of greater than about 30% in infrared region of the electromagnetic spectrum of 2500-3500 nm wavelength.

10. A lamp comprising:
a light-transmissive envelope having a surface; and
at least one light source, said envelope at least partially enclosing said at least one light source;
wherein at least a portion of the surface of the light-transmissive envelope is provided with an optical interference multilayer coating comprising a plurality of alternating first and second layers, said first layers having relatively low refractive index and said second layers having relatively higher refractive index than the first layers, wherein said second layers comprise NbTaZr oxide satisfying the atom ratios:

Nb/(Nb+Ta+Zr)<about 30% and

Ta/(Nb+Ta+Zr)>about 50%.

11. The lamp according to claim 10, wherein said second layers comprise NbTaZr oxide satisfying the atom ratios:

about 5%<Nb/(Nb+Ta+Zr)<about 30% and about 80%>Ta/(Nb+Ta+Zr)>about 50%.

12. The lamp according to claim 10, wherein said at least one light source comprises a filament and wherein said coating has an average transmittance of greater than about 60% in visible light of 400-750 nm wavelength, and has an average reflectance of greater than about 50% in the infrared region of the electromagnetic spectrum of 800-1500 nm wavelength.

13. The lamp according to claim 10, wherein said coating is capable of repeated cycling between room temperature and about 750° C. without significant mechanical degradation of the first and second layers.

14. The lamp according to claim 10, wherein said coating exhibits a transmission loss of less than about 5% in the visible light of 400-750 nm wavelength after annealing at about 800° C. for about 4 d.

15. The lamp according to claim 10, wherein said at least one light source comprises a filament and wherein said lamp, when energized to a hot filament temperature, exhibits an LPW gain of from about 20% to about 150% as compared to the same lamp energized to the same hot filament temperature without said coating.

16. The lamp according to claim 10, further comprising at least one electric element arranged in the envelope and connected to current supply conductors extending through the envelope.

17. The lamp according to claim 10, wherein the at least one light source comprises an electric arc or a discharge, and wherein said coating is configured to provide an average transmittance in visible light of greater than 60% and provide an average reflectance of greater than about 30% in the ultraviolet region of the electromagnetic spectrum of 300-370 nm wavelength.

18. The lamp according to claim 10, wherein the envelope encloses a fill gas comprising a halogen-containing gas.

19. The lamp according to claim 10, wherein the envelope comprises at least one of glass, quartz, fused silica, and substantially transparent ceramic.

20. The lamp according to claim 10, wherein said optical interference multilayer coating is provided on one or both of an inner surface and an outer surface of said envelope.

21. A lamp comprising:
a light-transmissive envelope having a surface; and
at least one light source, said envelope at least partially enclosing said at least one light source;
wherein at least a portion of the surface of the light-transmissive envelope is provided with an optical interference multilayer coating comprising a plurality of alternating first and second layers, said first layers having relatively low refractive index and said second layers having relatively higher refractive index than the first layers,
wherein said second layers comprise NbTaZr oxide satisfying the atom ratios:

Nb/(Nb+Ta+Zr)<about 30% and

Ta/(Nb+Ta+Zr)>about 50%;

wherein said coating has an average transmittance of greater than about 60% in visible light of 400-750 nm wavelength, and wherein said coating exhibits a transmission loss of less than about 5% in the visible light of 400-750 nm wavelength after annealing at about 800° C.

* * * * *